(12) United States Patent
Chen et al.

(10) Patent No.: US 6,863,936 B2
(45) Date of Patent: Mar. 8, 2005

(54) METHOD OF FORMING SELECTIVE ELECTROLESS PLATING ON POLYMER SURFACES

(75) Inventors: William T. Chen, Endicott, NY (US); Peter M. Moran, Singapore (SG); Harvey M. Phillips, Sichuan (CN)

(73) Assignee: Agency for Science, Technology and Research, Centros (SG)

( * ) Notice: Subject to any disclaimer, the term of this patent is extended or adjusted under 35 U.S.C. 154(b) by 19 days.

(21) Appl. No.: 10/029,435

(22) Filed: Dec. 18, 2001

(65) Prior Publication Data

US 2002/0076497 A1 Jun. 20, 2002

(30) Foreign Application Priority Data

Dec. 19, 2000 (SG) ..................................... 200007713-1

(51) Int. Cl.[7] .............................. B05D 3/06; B05D 3/10; H05K 3/18; H05K 3/24; H01C 17/14
(52) U.S. Cl. .......................... 427/554; 427/98; 427/304; 427/306; 205/92; 205/126; 205/136; 216/64; 216/94; 219/121.69; 219/121.71
(58) Field of Search .................................. 427/554, 555, 427/556, 98, 305, 304, 306; 205/92, 126, 136; 216/65, 94; 219/121.69, 121.71

(56) References Cited

U.S. PATENT DOCUMENTS

| | | | |
|---|---|---|---|
| 4,659,587 A | * | 4/1987 | Imura et al. |
| 4,877,644 A | * | 10/1989 | Wu et al. .................... 427/556 |
| 5,011,567 A | * | 4/1991 | Gonsiorawski ........ 219/121.69 |
| 5,035,918 A | * | 7/1991 | Vyas .......................... 427/556 |
| 5,084,299 A | | 1/1992 | Hirsch et al. ............... 427/53.1 |
| 5,185,055 A | * | 2/1993 | Temple et al. .............. 427/259 |
| 5,264,108 A | | 11/1993 | Mayer et al. ............... 205/125 |
| 5,487,852 A | * | 1/1996 | Ludden et al. ......... 219/121.71 |
| 6,127,052 A | * | 10/2000 | Tomari et al. ............... 428/680 |
| 6,203,652 B1 | * | 3/2001 | Egitto et al. ........... 219/121.71 |
| 6,211,485 B1 | * | 4/2001 | Burgess ................. 219/121.71 |
| 6,251,488 B1 | * | 6/2001 | Miller et al. ................ 427/596 |
| 6,585,904 B2 | * | 7/2003 | Kukanskis et al. ........... 216/65 |

FOREIGN PATENT DOCUMENTS

| | | |
|---|---|---|
| EP | 0 151 413 A2 | 8/1985 |
| EP | 0 260 514 B1 | 6/1991 |
| WO | WO 92/21790 | * 12/1992 |
| WO | 00/57680 | 9/2000 |

OTHER PUBLICATIONS

Abstract of JP 2000212756–A, Derwent Abstract Accession No. 2000–546485/50, Class M13, Omron KK Aug. 2, 2002.
Derwent Abstract Accession No. 90–373810/50 Class V04, RD 319042 a (ANONYMOUS) Oct. 20, 1990.
Derwent Abstract Accession No. 90–373861/50 Class V04, RD 319093 A (ANONYMOUS) Oct. 20, 1990.
Derwent Abstract Accession No. 91–205398/28 Class V04. RD 326046 A (ANONYMOUS) May 20, 1991.

* cited by examiner

Primary Examiner—Marianne Padgett
(74) Attorney, Agent, or Firm—Ladas & Parry

(57) ABSTRACT

A method of plating an aromatic polymer substrate comprises: applying a strippable coating of a non-aromatic polymer to a substrate surface to be plated; selectively illuminating the coated substrate surface with laser light to ablate a selected area of the strippable coating and to activate an underlying region of the substrate surface exposed by the ablation of the strippable coating; contacting the substrate surface with a seeding solution containing polymer-stabilised catalytic seeding particles, so that the seeding particles adhere preferentially to the activated region of the substrate; and electrolessly plating the substrate surface, whereby the seeded areas of the substrate surface are selectively plated.

21 Claims, 3 Drawing Sheets

METHOD OF FORMING SELECTIVE ELECTROLESS PLATING ON POLYMER SURFACES

Figure 1A:
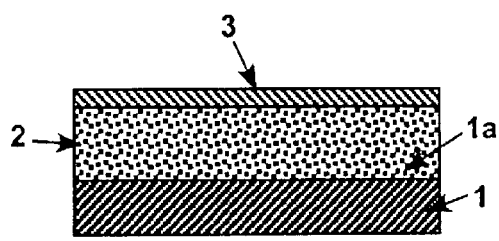

This invention relates to the plating of polymer surfaces and, in particular, to the metallisation of printed circuit boards and flexible substrates.

The Applicant has already proposed a method of selectively plating an aromatic polymer surface comprises illuminating the polymer surface with a laser light to activate desired regions of the surface to be provided with metallisation. When the surface is subsequently immersed in a plating solution, selective seeding occurs on the regions of the polymer surface that have been activated by the laser and metal is deposited on the surface in the desired pattern. Whilst this method is effective in achieving plating of the selectively activated areas, it is found that some seeding, and consequently some plating, occurs outside the activated regions of the polymer surface. In an attempt to minimise this undesired effect, it has been proposed to dilute the seeding solution with water but this does not entirely eliminate the formation of plating in the non-activated areas. As a result, it is difficult to use the prior method in industrial applications.

The present invention aims to provide a plating method which overcomes the disadvantages of the known method and is suitable for use in industrial applications.

Accordingly, in one aspect, the present invention provides a method of plating a substrate material, which when activated by laser light adsorbs seeding particles for an electroless plating process, comprising: applying a strippable coating to a substrate surface to be plated; selectively illuminating the coated substrate surface with laser light to ablate a selected area of the strippable coating and activate an underlying region of the substrate surface exposed by the ablation of the strippable coating; contacting the substrate surface with seeding particles for electroless plating, so that seeding particles adhere preferentially to the activated region of the substrate surface; and electrolessly plating the substrate surface, whereby the seeded areas of the substrate surface are selectively plated.

In one embodiment of the invention, the coating is stripped from the polymer surface after the step of seeding the surface, thereby removing any undesired seeding particles on the coating prior to plating.

In another embodiment, the coating is stripped from the polymer surface after the step of plating the surface, thereby removing any undesired plating with the coating.

In another aspect, the invention provides a substrate formed with circuitry which includes vias having a non-circular cross-section, thereby enabling the density of the substrate circuitry to be increased.

In yet a further aspect, the invention provides a method of re-mapping a wafer, comprising using a laser to re-configure an existing circuit pattern on a surface of the wafer.

Figure 2A:
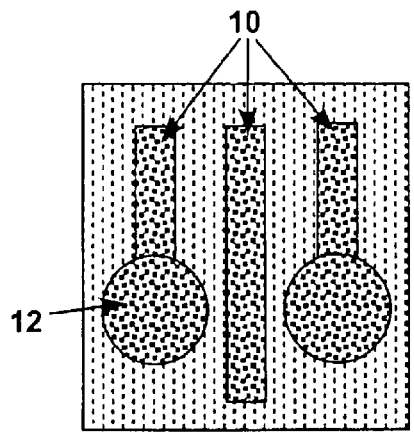
Figure 2B:
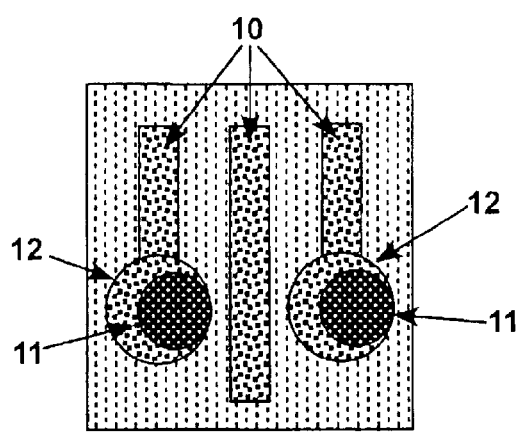
Figure 3A:
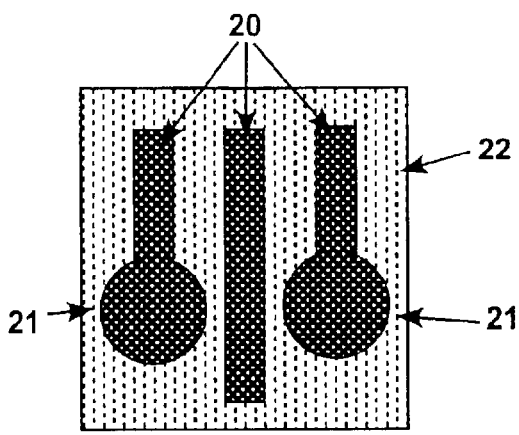
Figure 3B:
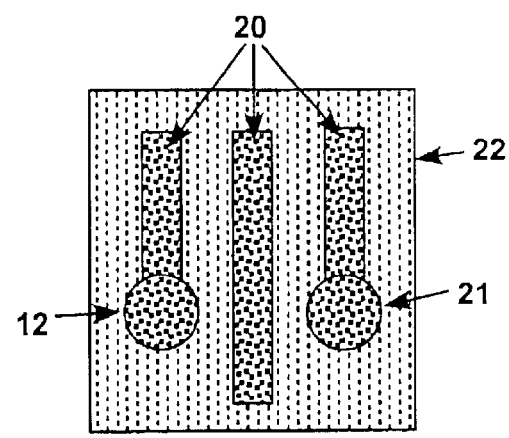
Figure 4A:
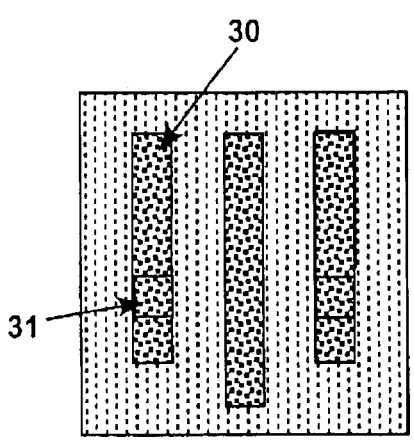
Figure 4B:
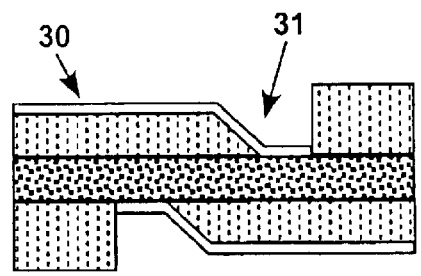

In order that the invention may be readily understood embodiments thereof will now be described in more detail, by way of example, with reference to the accompanying drawings, in which:

FIGS. 1(a) to 1(h) are diagrammatic illustrations of the steps in a plating method embodying the present invention;

FIGS. 2(a) and 2(b) illustrate a known method of forming vias on a polymer substrate;

FIGS. 3(a) and 3(b) illustrate a method of forming vias using the method of the present invention;

FIGS. 4(a) and 4(b) illustrate the formation of non-circular vias using a method embodying the present invention; and FIGS. 5(a) to 5(d) illustrate a method of re-mapping a semiconductor wafer employing a method embodying the invention.

The FIGS. 1(a) to 1(h) of the drawings show the various stages of a method embodying the invention for plating a substrate 1, for example a semiconductor substrate, provided with a layer 2 of an aromatic polymer, such as a polyimide, a polycarbonate or an epoxy, on a surface 1a of the substrate to be plated.

As shown in FIG. 1(a), in a first step of the method, a thin coating 3 of a strippable, non-aromatic polymer is applied to the aromatic polymer substrate layer 2. In this context, the term "strippable" is used to denote a material that can subsequently be easily removed, for example by immersion in a solvent, without significantly damaging the underlying aromatic polymer surface.

Figure 1E:
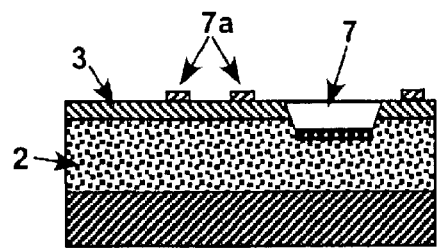
Figure 1B:
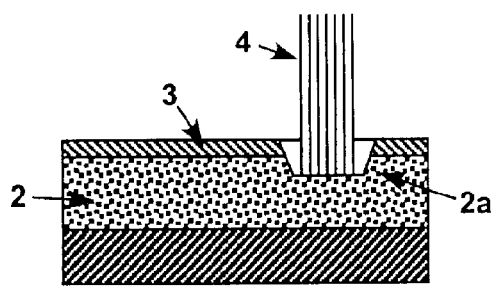

FIG. 1(b) illustrates a second step of the method in which light 4 from a laser (not shown) is used to selectively activate the aromatic polymer. In this procedure, the laser light 4 first ablates the coating 3 over a selected area of the aromatic polymer layer 2 to expose the layer 2 and then activates the exposed aromatic polymer surface. During activation of the aromatic polymer, the laser power is reduced below the threshold power for ablation of the aromatic polymer and the laser light is directed at the area to be activated until the area in question turns or begins to turn black. In the course of activation, the aromatic polymer surface is not only roughened, but is also chemically altered, causing a change in its surface charge. If require, and as shown in FIG. 1(b), the aromatic polymer may also be ablated to a desired depth before activating the surface of the aromatic polymer, thereby producing a recess 2a with an activated surface 5 in the surface of the aromatic polymer layer 2 as shown in FIG. 1(c).

Figure 1F:
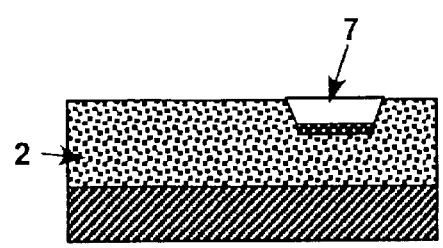
Figure 1C:
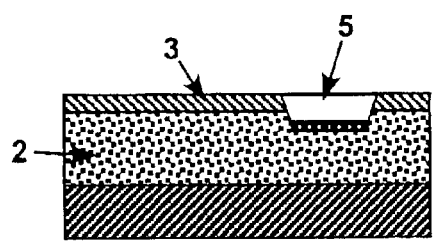

For simplicity, FIGS. 1(a) to 1(c) only show the activation of a single region of the aromatic polymer layer but it will be appreciated that any desired number of discrete areas or pattern of interconnected areas may be selectively activated by directing the laser light appropriately.

Once the desired surface areas of the aromatic polymer layer 2 have been activated, the substrate may be selectively plated as will now be described with reference to FIGS. 1(d) to 1(h).

Figure 1G:
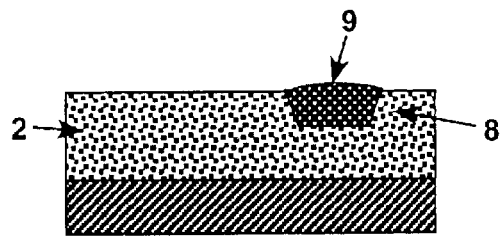
Figure 1D:
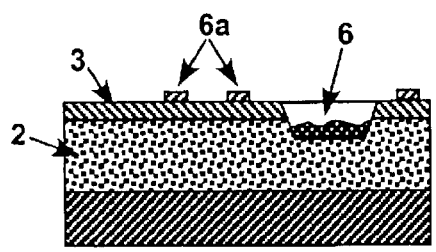

Referring to FIG. 1(d), to achieve plating of the selectively activated areas of the aromatic polymer layer 2, the substrate is first immersed in a seeding solution for electroless plating, containing polymer-stabilised catalytic particles such as polyvinylpyrrolidone (PVP) stabilised palladium particles. In this environment seeding particles 6 (shown on a grossly exaggerated scale in FIG. 1(d)) from the seeding solution are preferentially adsorbed on the activated surface areas of the aromatic polymer. Potentially, however, stray seeding particles 6a may adhere to the non-activated surfaces of the polymer coating 3.

In one variant of the method embodying the invention, the substrate with its polymer coating 3 still in place is then immersed in an electroless plating bath to form a thin layer 7 of metal on the seeded areas of the surface, see FIG. 1(e). Again, whilst the metal layer 7 will be preferentially deposited on the heavily seeded activated areas of the aromatic polymer, some stray plating 7a may form on the polymer coating 3 at the sites of the stray seeding particles 6a. Prior to immersion in the electroless-plating bath, the substrate may be rinsed in ultra pure water and/or possibly subjected to ultrasound cleaning to remove stray seeding particles which are only weakly adhering to the non-activated regions of the substrate.

In the following step of the method, the polymer coating 3 is stripped from the surface of the aromatic polymer. In general, the removal of the coating may be achieved by immersion in a suitable solvent but it is envisaged that any stripping method which doe not significantly damage the aromatic polymer may be used. Any stray plating 7a adhering to the strippable coating 3 is removed with the coating, leaving only the plating 7 on the activated regions of the aromatic polymer as shown in FIG. 1(f).

As shown in FIG. 1(g), a further layer of metal may, if required, then be deposited on the initial plating layer 7 by electroless-plating or by electroplating to form a thicker metallisation 8.

Figure 1H:
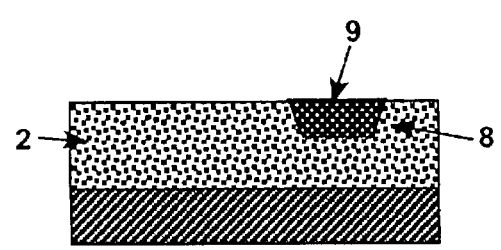

Finally, if desired, the exposed surface 9 of the metallisation 8 may be planarised as shown in FIG. 1(h).

In another variant of the method embodying the invention, the polymer coating 3 is stripped from the substrate after the seeding step and before the initial electroless-plating step. In this variant of the method, any stray seeding particles adhering to the surface of the coating 3 are removed together with the coating, so that plating only forms on the activated areas of the aromatic polymer during the subsequent electroless-plating step.

A plating method embodying the present invention finds particular application in the fabrication of landless vias and this aspect of the invention will now be described with reference to FIGS. 2 to 4 of the drawings.

Referring to FIGS. 2(a) and 2(b), present practice requires the surface circuitry 10 on printed circuit boards (PCBs) and flexible substrates to be patterned separately from the drilling and metallisation of any vias 11. In a typical process, the surface circuitry 10 is patterned first as shown in FIG. 2(a), leaving lands 12, i.e. large circular areas, through which the vias 11 are subsequently drilled as shown in FIG. 2(b). Such lands 10 are necessary for alignment during the drilling of the vias 11.

Using a plating method embodying the present invention it is possible to drill the vias and activate the surface and vias in one step. It is also possible to metallise the vias and surface circuitry in one step. Thereby eliminating the need for alignment between steps and obviating the need for lands. Without lands denser circuitry is possible.

FIG. 3(a) shows a substrate to be plated by a method embodying the invention after the drilling of the vias and activation of the circuitry and vias, while FIG. 3(b) shows the same substrate after plating. Thus, FIGS. 3(a) and 3(b) show vias 21 drilled in a coated substrate 22 and then laser activated for seeding together with surface circuit patterns 20. The activated surfaces of the vias 21 and the circuit patterns 20 are then selectively plated as described above with reference to FIGS. 1(d) to 1(h).

A further development is illustrated in FIGS. 4(a) and 4(b), which are respectively a plan view and a cross-sectional view of a substrate formed with non-circular vias. In this further development, non-circular vias, such as slot-shaped vias 31, are formed and plated together with circuit patterns 30 by the method embodying the invention. This allows the circuitry to be made even more dense.

Figure 5A:
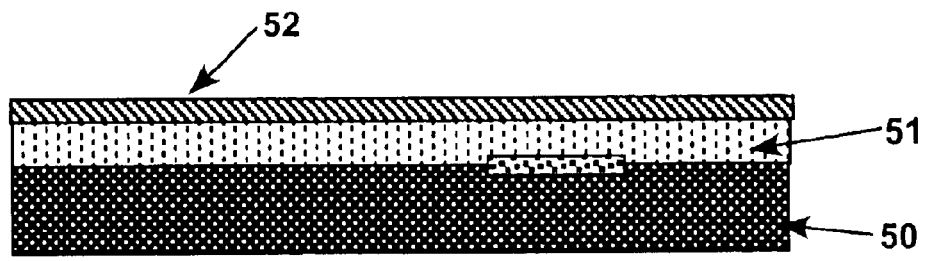
Figure 5B:
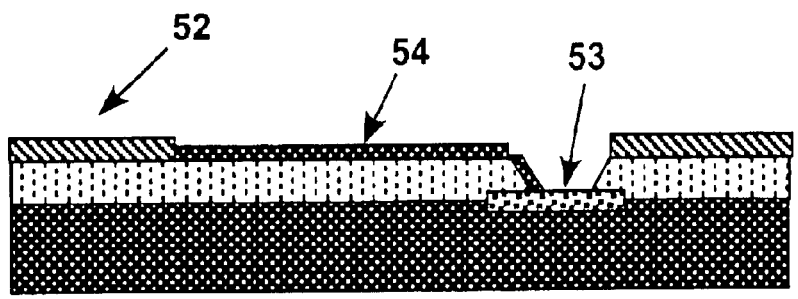
Figure 5C:
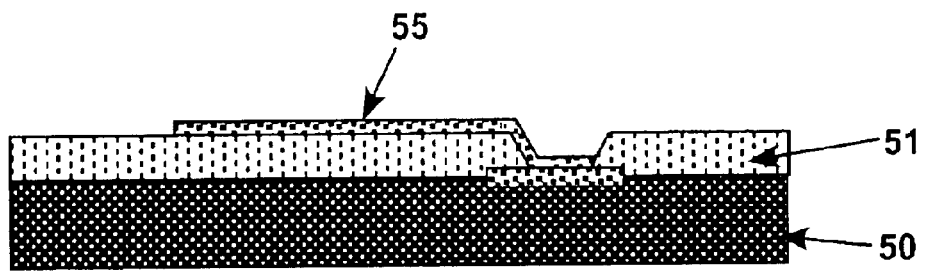
Figure 5D:
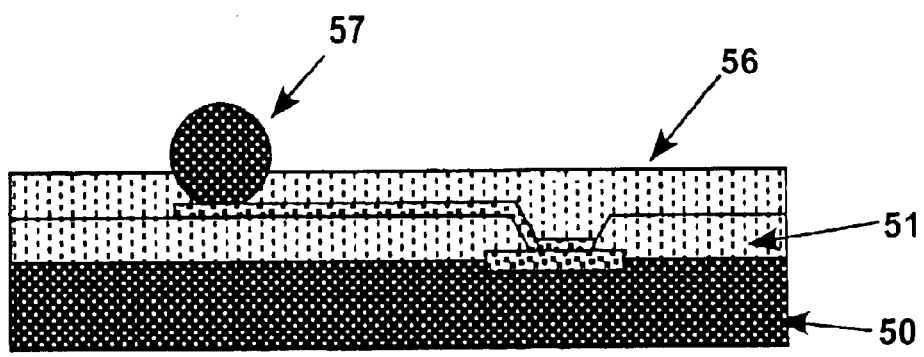

FIGS. 5(a) to 5(d) illustrate another application of the invention, in this case to the re-mapping of a wafer. Referring to FIG. 5(a) this first involves applying an aromatic polymer layer 51 to the wafer 50 to be re-mapped and covering the layer of aromatic polymer with a strippable coating 52 of a non-aromatic polymer. A laser is used to ablate through the strippable layer 52 and to drill vias 53, see FIG. 5(b), the laser power then being reduced to activate the exposed surface 54 of the aromatic polymer layer 51. The activated surface is next seeded and the strippable coating is removed, FIG. 5(c). The seeded surface is finally plated in an electroless bath to form the re-mapping plated circuitry 55 which is shown in finished form in FIG. 5(d), in which the new vias 53 and circuit pattern 55 on the aromatic polymer layer 51 re-map the wafer into the desired configuration. FIG. 5(d) also shows a solder ball 57 for connecting the re-mapped circuitry to a substrate (not shown) and a solder mask 56 for protecting the surface of the remapped wafer 50 during soldering, the mask 56 having an aperture receiving the solder ball 57.

The method of the present invention can also be used to fabricate fine-line circuitry by using the laser light to ablate completely through the strippable coating and partially through the layer of aromatic polymer to produce a channel. The bottom of the channel can then be activated by the laser for seeding. Once the bottom of the channel has been seeded and the strippable coating has been removed, plating will proceed upwards from the bottom of the channel. Unlike plating on a flat surface, the plating will thus be confined and the plated metal will simply grow upwards and not upwards and sideways as it would on a flat surface. This laser ablation of channels together with the strippable coating on the surface on the aromatic polymer layer enables the production of extremely fine-line circuitry embedded in the polymer layer.

A further application of a method embodying the present invention is in the field of integrated resistors. A major requirement in the microelectronics packaging industry is to reduce the bulk of passive circuit components, such as resistors, capacitors and inductors, which commonly occupy up 70% of the surface of a PCB or flex substrate. As a contribution to reducing the bulk of these passive components, a method embodying the present invention provides easy fabrication of integrated resistors by activating, seeding and plating a region on a substrate between two copper interconnects, the seeded region being plated with a high resistivity metal, such as a nickel-phosphorus or nickel cobalt alloy. Such a resistor occupies far less space than a non-integrated resistor.

Using a plating method embodying the invention also facilitates the rapid prototyping of circuit designs. Rapid prototyping is important in the microelectronics industry, since designers need to be able to test their new designs quickly and easily. Conventional circuit plating methods require a mask which is costly and time-consuming to produce with each new design requiring a new mask. Using a plating method in accordance with the present invention, which does not require a mask, enables rapid and efficient prototyping to be performed.

It is envisaged that a method embodying the invention could also be used to activate, seed and plate non-planar features on a surface, such as bumps, to serve as connectors or probes.

In the present specification "comprises" means "includes or consists of" and "comprising" means "including or consisting of".

The features disclosed in the foregoing description, or the following claims, or the accompanying drawings, expressed in their specific forms or in terms of a means for performing the disclosed function, or a method or process for attaining the disclosed result, as appropriate, may, separately, or in any combination of such features, be utilised for realising the invention in diverse forms thereof.

What is claimed is:

1. A method of plating a substrate material, which when activated by laser light adsorbs seeding particles for an electroless plating process, comprising a) applying a strippable coating to a substrate surface to be plated, wherein the substrate is an aromatic polymer and the shippable coating is a non-aromatic polymer;

b) selectively illuminating the coated substrate surface with laser light to ablate a selected area of the shippable coating and to activate an underlying region of the substrate surface exposed by the ablation of the strippable coating;

c) contacting the activated region of the substrate surface with seeding particles for electroless plating, whereby the seeding particles adhere preferentially to the activated region of the substrate surface; and d) electrolessly plating the activated region of the substrate surface, whereby the seeded area of the substrate surface is selectively plated.

2. A method according to claim 1, comprising removing the strippable coating after contacting the substrate surface with seeding particles but prior to electrolessly plating the substrate surface.

3. A method according to claim 1, comprising removing the strippable coating after electrolessly plating the substrate surface.

4. A method according to claim 1, comprising using the same laser to ablate the shippable coating and to activate the substrate surface, and reducing the power of the laser for the activation of the substrate surface.

5. A method according to claim 1, comprising depositing further metal on the electrolessly plated region of the substrate.

6. A method according to claim 5, comprising depositing the further metal by electroless plating.

7. A method according to claim 5, comprising depositing the further metal by electroplating.

8. A method according to claim 1, comprising ablating the substrate material underlying the ablated area of the strippable coating to form a recess in the substrate material before activating the substrate surface.

9. A method according to claim 8, comprising fabricating fine-line circuitry by ablating channels in the substrate material and filling the channels with metal after electroless plating of the activated surfaces of the channels to form circuitry embedded in the substrate material.

10. A method according to claim 1, comprising using the laser to ablate the strippable coating, selectively activate the substrate surface and drill a landless via in the substrate material in the same step.

11. A method according to claim 10, wherein the landless via is noncircular.

12. A method according to claim 11, wherein the non-circular landless via is slot-shaped.

13. A method according to claim 1, comprising electrolessly plating non-planar features on the substrate surface.

14. A method according to claim 1, comprising selectively activating a region, adsorbing seeding particles on the region and electrolessly plating the region on the substrate surface between two circuit interconnects placed on the substrate surface and thereby forming an integrated resistor.

15. A method according to claim 14, comprising plating the activated region with a nickel alloy to form the resistor.

16. A method according to claim 14 wherein the two interconnects placed on the substrate are copper interconnects.

17. A method according to claim 1 wherein the aromatic polymer is polyimide, polycarbonate or an epoxy polymer.

18. A method according to claim 1 wherein the substrate is immersed in a seeding solution for electroless plating, containing polymer-stabilised catalytic particles such as polyvinylpyrrolidone stabilised palladium particles.

19. A method for re-mapping a wafer comprising a) applying an aromatic polymer layer to the wafer to be re-mapped;

b) covering the aromatic polymer layer with a strippable coating, which is a non-aromatic polymer;

c) selectively illuminating the coated aromatic polymer layer surface with laser light to ablate a selected area of the strippable coating and to activate an underlying region of the aromatic polymer layer surface exposed by the ablation of the strippable coating;

d) contacting the activated region of the aromatic polymer layer surface with seeding particles for electroless plating; and e) electrolessly plating the activated region of the aromatic polymer surface, whereby the seeded area of the aromatic polymer substrate surface is selectively plated.

20. A method according to claim 19, comprising ablating through the strippable coating; drilling vias and activating the exposed surface of the aromatic polymer layer.

21. A method according to claim 19, wherein the strippable coating is removed after the activated surface is seeded and prior to the seeded surface is plated.

* * * * *